United States Patent
Khosla et al.

(10) Patent No.: US 9,275,884 B2
(45) Date of Patent: Mar. 1, 2016

(54) SYSTEMS AND METHODS FOR INHIBITING OXIDE GROWTH IN SUBSTRATE HANDLER VACUUM CHAMBERS

(75) Inventors: Mukul Khosla, San Jose, CA (US);
Ronald Powell, Portola Valley, CA (US);
Arun Keshavamurthy, Bangalore (IN);
Richard Blank, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 1006 days.

(21) Appl. No.: 13/419,625

(22) Filed: Mar. 14, 2012

(65) Prior Publication Data
US 2012/0251271 A1    Oct. 4, 2012

Related U.S. Application Data

(60) Provisional application No. 61/467,652, filed on Mar. 25, 2011.

(51) Int. Cl.
*H01L 21/677* (2006.01)
*C23C 14/56* (2006.01)

(52) U.S. Cl.
CPC ........ *H01L 21/67742* (2013.01); *C23C 14/564* (2013.01); *C23C 14/568* (2013.01)

(58) Field of Classification Search
CPC ................. H01L 21/67748; H01L 21/68707

USPC .......................................... 294/64.3
See application file for complete search history.

(56) References Cited

U.S. PATENT DOCUMENTS

| | | | | |
|---|---|---|---|---|
| 6,095,582 | A * | 8/2000 | Siniaguine | H01L 21/6838 294/64.3 |
| 6,293,749 | B1 * | 9/2001 | Raaijmakers et al. | 414/609 |
| 6,322,116 | B1 * | 11/2001 | Stevens | B25B 9/00 294/64.3 |
| 6,632,281 | B2 * | 10/2003 | Kitano et al. | 118/58 |
| 2009/0175705 | A1 * | 7/2009 | Nakao et al. | 414/196 |

FOREIGN PATENT DOCUMENTS

JP    2009170740 A  *  7/2009

OTHER PUBLICATIONS

JP 2009-170740 A (Sakata) Jul. 30, 2009 (English language machine translation). [online] [retrieved May 18, 2015]. Retrieved from: AIPN Japanese Patent Office.*
JP2009170740 English translation.*

* cited by examiner

*Primary Examiner* — Jonathan Snelting

(57) ABSTRACT

A substrate handling robot includes an arm section and a wrist portion connected to the arm section. An end effector is connected to the wrist portion and is configured to support a substrate. A housing is arranged adjacent to the end effector and includes a gas outlet that directs gas onto an exposed surface of the substrate during transport.

9 Claims, 7 Drawing Sheets

SYSTEMS AND METHODS FOR INHIBITING OXIDE GROWTH IN SUBSTRATE HANDLER VACUUM CHAMBERS

CROSS-REFERENCE TO RELATED APPLICATIONS

This application claims the benefit and priority of 61/467,652, filed Mar. 25, 2011. The entire disclosure of the above application is incorporated herein by reference.

FIELD

The present disclosure relates to substrate processing systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems such as semiconductor processing systems may be used to deposit film layers, metal layers or other types of layers onto a substrate such as a semiconductor wafer. The substrate processing system may include one or more processing stations. While semiconductor wafers used in microelectronic production currently have diameters in the range of about 150 mm to 300 mm, next-generation tools are expected to handle 450 mm wafers. Similarly designed substrate processing systems are also used to process large rectangular glass plates for applications such as photovoltaics, flat panel displays, and electrochromic windows.

A substrate handling robot associated with a vacuum transfer chamber may be used to move the substrates from a load lock to one of the processing stations of the processing chamber and/or between the stations of the processing chamber. The vacuum transfer chamber allows the transfer to be performed in a vacuum. Gases are typically introduced into the vacuum transfer chamber through a gas delivery tube or a gas diffuser connected to the vacuum transfer chamber. A location of the gas delivery tube or the gas diffuser is stationary relative to the vacuum transfer chamber.

During transfers, it is desirable to avoid degradation of the film layers of the substrate. For example only, one processing station may deposit a dielectric layer onto a wafer. Degradation of the dielectric layer may occur when transferring the wafer through the vacuum transfer chamber to another one of the processing stations. For example only, another processing station may deposit a metal layer, such as copper, onto the wafer. Oxidation of the metal layer may occur when transferring the wafer through the vacuum transfer chamber. Unwanted contamination such as hydrocarbons in the residual gases of the vacuum transfer chamber as well as particles may also deposit onto the wafer surface during transport.

Current technology to inhibit oxide formation or dielectric degradation on the substrate typically involves using high gas flows to dilute oxygen or water vapor content. The pressure setting in the vacuum transfer chamber is usually a constant value that is based on the application performed in the wafer process modules (e.g. deposition or etch). The high gas flow generally requires large capacity vacuum pumps to hold chamber pressure at a constant pressure value. Large capacity pumps are typically more expensive and have a relatively large footprint, which tends to increase cost per unit area in a fabrication facility.

SUMMARY

This section provides a general summary of the disclosure, and is not a comprehensive disclosure of its full scope or all of its features.

A substrate handling robot includes an arm section and a wrist portion connected to the arm section. An end effector is connected to the wrist portion and is configured to support a substrate. A housing is arranged adjacent to the end effector and includes a gas outlet that directs gas onto an exposed surface of the substrate during transport.

In other features, the housing includes an inlet, an outlet end including the gas outlet, a top surface, a bottom surface and side walls. The housing comprises a plurality of baffles that are arranged between the side walls, the top surface, and the bottom surface and adjacent to the gas outlet. At least one of the plurality of baffles is arranged generally parallel to the side walls. At least another one of the plurality of baffles is arranged at an non-zero angle relative to the at least one of the plurality of baffles.

In other features, the gas outlet comprises a slit. The gas comprises one of an inert gas, a non-reactive gas, a reactive gas, and an activated gas.

In other features, a flexible tube is arranged inside of the arm section and connects the inlet of the housing to a gas source. The gas is directed onto the substrate during transfer of the substrate between at least one of a substrate cassette and a processing chamber, first and second stations of a processing chamber, and a load lock and a station of a processing chamber.

A method includes loading a substrate onto an end effector of a substrate handling robot; and while transferring the substrate from a first location to a second location on the end effector, directing gas onto an exposed surface of the substrate.

In other features, the method includes arranging a housing on one of the end effector and a wrist portion between an arm section of the substrate handling robot and the end effector. The method includes directing a gas outlet of the housing onto the substrate.

In other features, the housing includes an inlet, an outlet end including the gas outlet, a top surface, a bottom surface and side walls. The method include arranging a plurality of baffles of the housing between the side walls, the top surface, and the bottom surface and adjacent to the gas outlet.

In other features, the method includes arranging at least one of the plurality of baffles generally parallel to the side walls; and arranging at least another one of the plurality of baffles at a non-zero angle relative to the at least one of the plurality of baffles.

In other features, the gas comprises one of an inert gas, a non-reactive gas, a reactive gas, and an activated gas. The method includes connecting a gas source to the inlet of the housing a flexible tube arranged inside of an arm section. The method include directing the gas onto the substrate during transfer between at least one of a substrate cassette and a processing chamber, first and second stations of a processing chamber, and a load lock and a station of a processing chamber.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

DETAILED DESCRIPTION

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

The present disclosure describes systems and methods to supply a localized gas across an exposed surface of a substrate during transfer. For example only, the transfer may occur from one processing station of the processing chamber to another processing station via a vacuum transfer chamber or from a load lock through the vacuum transfer chamber to the processing chamber.

Figure 1:
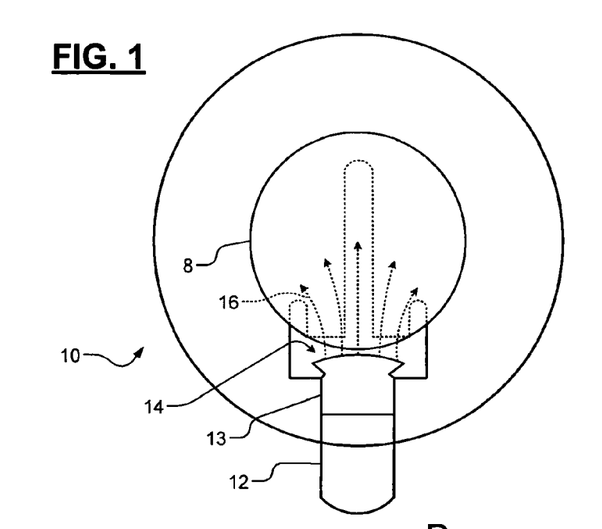
FIG. 1 is a plan view of an end effector of a substrate handling robot that includes a housing with a gas outlet according to the present disclosure.

Referring now to FIG. 1, a substrate 8 such as a semiconductor wafer is shown located in a chamber 10. An end effector 12 of a substrate handling robot (not shown in FIG. 1) includes a housing 13 having a gas outlet 14. For example only, the housing 13 may be arranged on or adjacent to a wrist portion of the substrate handling robot.

The gas outlet 14 of the housing 13 discharges gas across the exposed surface of the substrate 8. The housing 13 and the gas outlet 14 are located outside of a diameter of the substrate 8. In some examples, the gas may comprise purge gas that acts to dilute oxygen and water content from the exposed surface of the substrate 8, which inhibits oxide formation. FIG. 1 shows an example of flow path lines 16 of the gas across the substrate 8. As can be appreciated, the gas forms a protective blanket over the exposed surface of the substrate 8 during transfer. The gas flow also serves to prevent particles from settling onto the wafer surface and may dislodge particles and remove them by entrainment into the flow of gas.

For example only, the gas may be used to reduce oxide growth on metal, such as copper. The gas can also be used with other metal layers of a substrate such as but not limited to aluminum (Al), titanium (Ti), tantalum (Ta), ruthenium (Ru), cobalt (Co), or tungsten (W), as well as alloys and compounds of metals such as tantalum nitride (TaN) and titanium nitride (TiN) that are subject to oxidation and surface contamination. For example only, protecting copper can be challenging at elevated temperatures (~300° C.) where parts per million (ppm) levels of oxidants in the background ambient can form a monolayer of copper oxide ($Cu_2O$) on the wafer during short transport intervals (such as 10 sec of robotic transport).

The present disclosure creates a controlled, protective ambient environment during substrate transport. The localized gas can also prevent degradation of the dielectric constant (k) of an exposed layer, which helps with various exposed metals and interlayer dielectrics, as well as conducting or insulating barriers, liners and capping layers used in microelectronic fabrication.

The purge gas can be an inert gas, such as argon, or a non-reactive gas such as molecular nitrogen ($N_2$), either of which acts to dilute the partial pressure of oxygen or water vapor at the substrate. In another example, the purge gas can be a reactive gas such as hydrogen ($H_2$) or ammonia ($NH_3$) or nitrogen trifluoride ($NF_3$). In this case, the purge gas both dilutes the concentration of undesired ambient gases and increases the concentration of desired active species at the wafer surface. Still other types of gases or gas mixtures may be used.

Activated gases or gas mixtures can also be used. A gas energizer such as a remote plasma generator, ultraviolet (UV) light and/or heat source may be used to activate gas species before the gas species is introduced at the surface of the substrate. As a non-limiting example, active nitrogen atoms may be produced by flowing molecular nitrogen, ammonia, $NF_3$ or chlorine trifluoride ($ClF_3$) through a plasma source or by exposing the gases to a UV lamp with appropriately selected wavelength(s) to generate the desired active atoms. Reactive atomic oxygen atoms or ozone ($O_3$) may be produced in a similar fashion. This opens the possibility of actively processing wafers during robotic transport which tends to improve the throughput for selected process steps. As another non-limiting example, damage to low-k materials may be repaired on the fly by dosing the substrate during robotic transfer with a suitable silylating agent.

Figure 2:
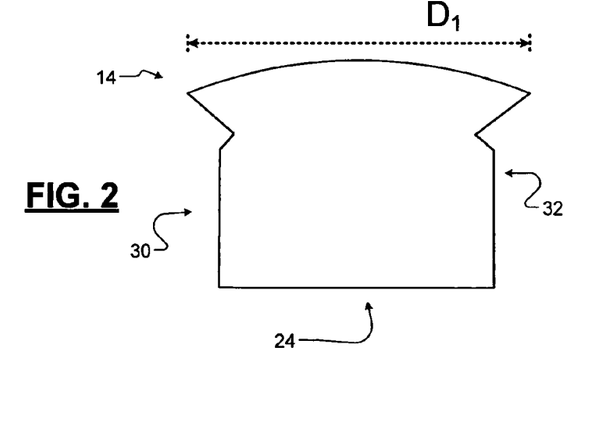
FIG. 2 is a plan view of an example of the housing.
Figure 3:
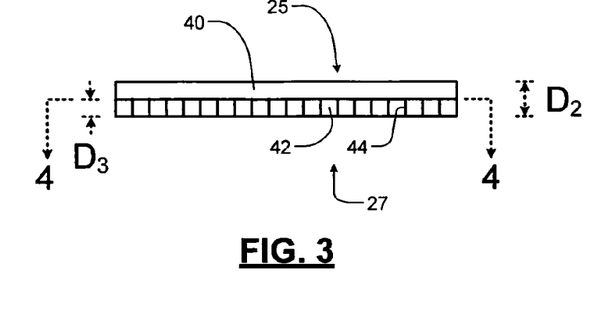
FIG. 3 is an end view of the housing.
Figure 4:
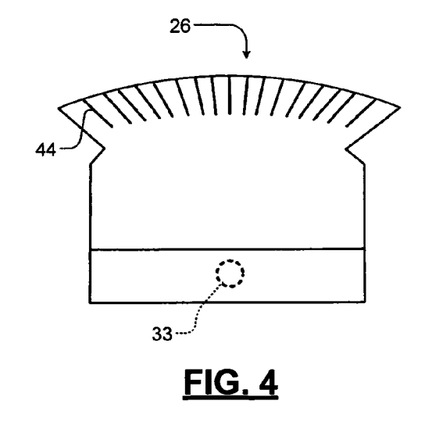
FIG. 4 is a cross-sectional view of the housing taken along line 4-4 in FIG. 3.

Referring now to FIGS. 2-4, the gas outlet is shown in further detail. In FIG. 2, the housing 13 includes a first end 24, the gas outlet 14, a top surface 25, a bottom surface 27 and side walls 30 and 32. The housing 13 includes an inlet 33 that is attached to a gas source. For example, the housing 13 may include a male connector (not shown) that mates to a flexible tube, although other types of connections may be used. In FIG. 3, the gas outlet 14 of the housing 13 includes a small diffuser-type plenum. In some examples, a top portion 40 of the gas outlet 14 comprises a wall and a lower portion 42 of the gas outlet 14 is open to allow flow of gas.

In some examples, a plurality of baffles 44 may be arranged adjacent to the lower portion 42 and may be used to direct the flow of the gas. In other examples, the baffles 44 may be omitted. If the baffles 44 are used, one or more central ones of the baffles 44 may be arranged in line with the flow of the gas and one or more other baffles 44 can be arranged at progressively larger angles as a distance from the central one of the baffles 44 increases to help disburse the gas. The baffles 44 create the flow path lines 16 of the gas across the substrate 8 as shown in FIG. 1.

As can be appreciated, the gas forms a protective blanket over the exposed surface of the substrate 8. While a particular arrangement of the baffles 44 is shown in FIG. 4, other baffle arrangements may be used. For example only in FIGS. 2-3, $D_1$ may be equal to about 6.5", $D_2$ may be 0.5" and $D_3$ may be 0.1", although other dimensions may be used.

Figure 5:
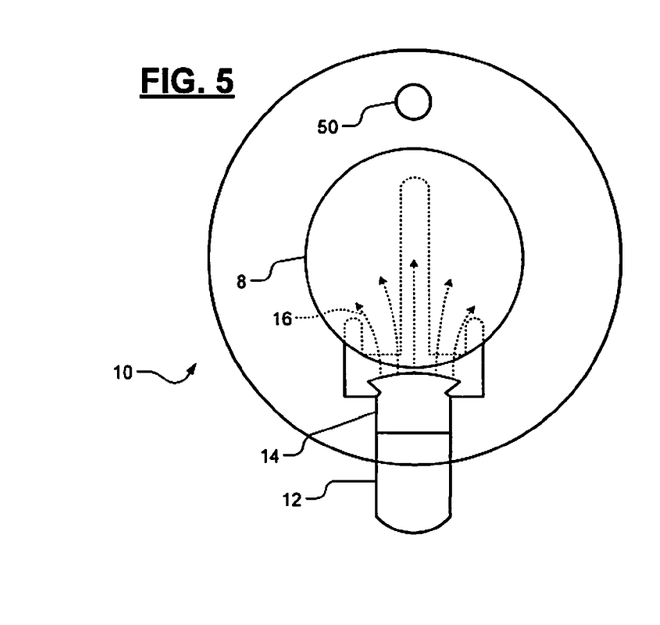
FIG. 5 illustrates a housing arranged adjacent to the end effector and a gas exhaust of the chamber.
Figure 6:
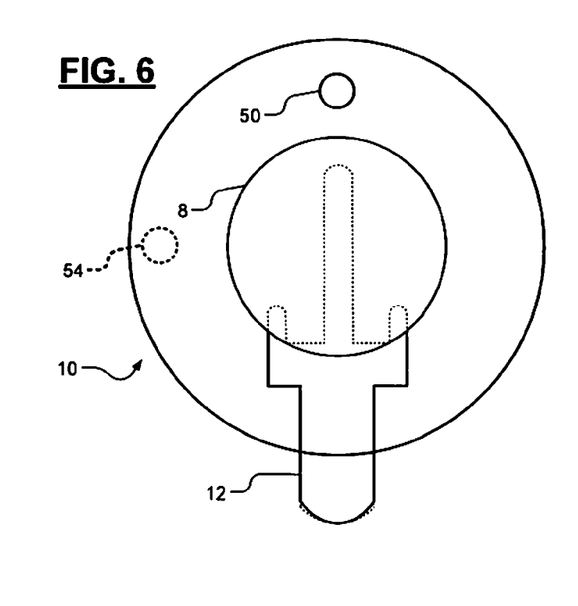
FIG. 6 illustrates a model with a gas source arranged on a top wall of the chamber.
Figure 7:
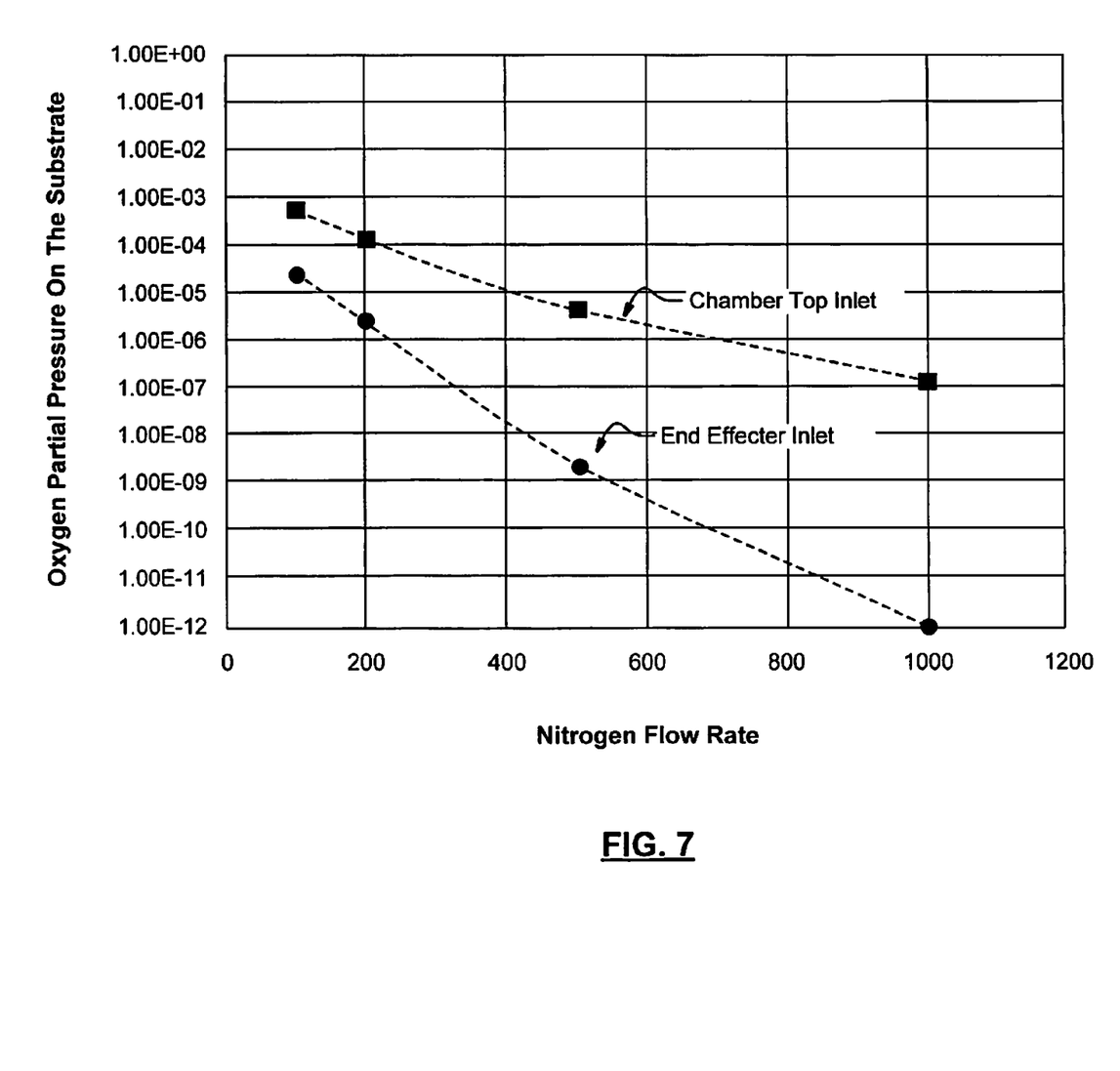
FIG. 7 illustrates the partial pressure of $O_2$ as a function of gas flow rates for the gas configurations of FIGS. 5 and 6.

Referring now to FIGS. 5-7, the location of the gas source can affect the partial pressure on the substrate. In FIG. 5, the housing 13 is arranged adjacent to the end effector 12 and a gas exhaust 50 is arranged on a bottom surface of the chamber 10. In FIG. 6, a gas source 54 is arranged on a top surface of the chamber 10 and the gas exhaust 50 is arranged on a bottom surface of the chamber 10. In FIG. 7, the partial pressures of $O_2$ are shown as a function of gas flow rates for the gas configurations of FIGS. 5 and 6, respectively. As can be appreciated, positioning the gas source adjacent to the end effector tends to reduce the partial pressure of oxygen on the substrate.

Figure 8:
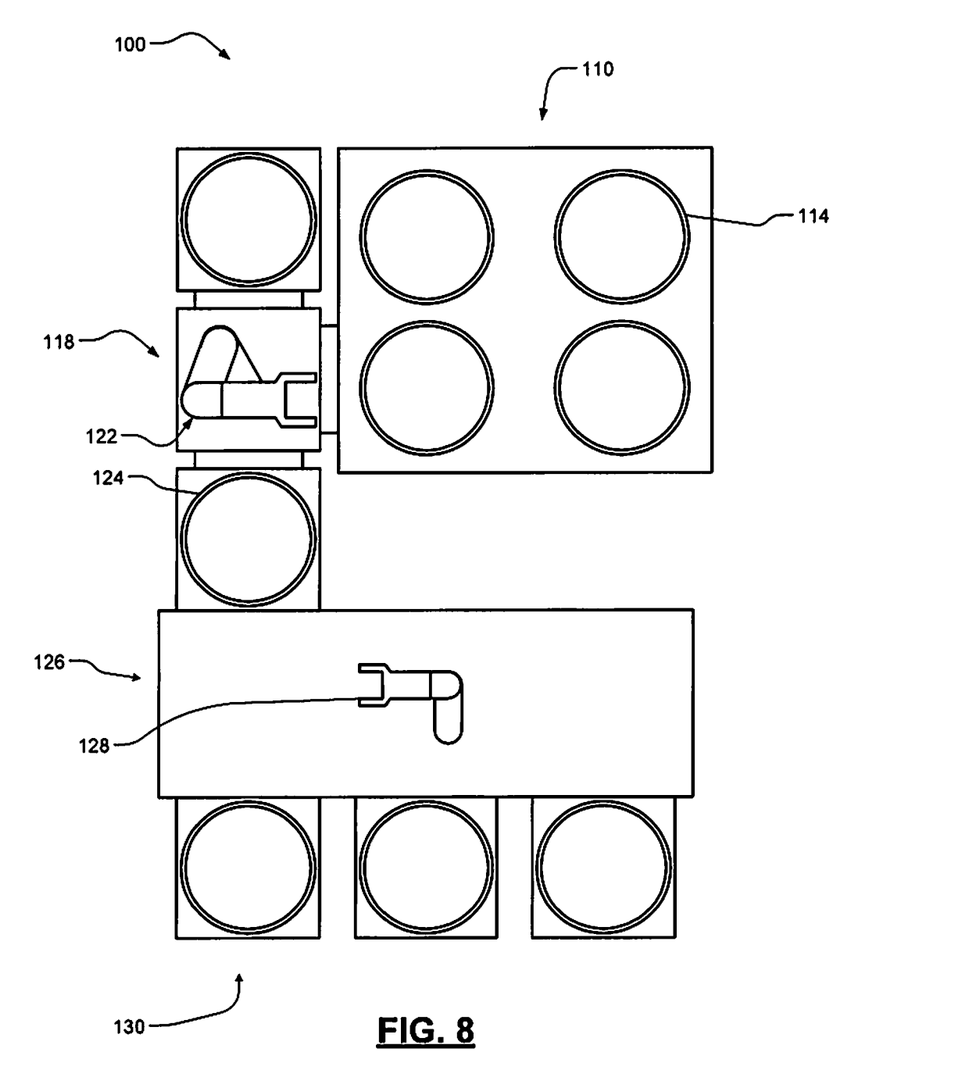
FIG. 8 illustrates an example of semiconductor processing system with a processing chamber and a vacuum transfer chamber.

Referring now to FIG. 8, an example of a substrate processing system 100 includes a processing chamber 110 with one or more stations 114. A vacuum transfer chamber 118 is in communication with the processing chamber 110 via valves (not shown) and includes a substrate handling robot 122. A load lock 124 is in communication with the vacuum transfer chamber 118 via valves (not shown) such as slit valves. A cleaning chamber (not shown) may also be used. If used, the cleaning chamber may be arranged on an unoccupied side of the vacuum transfer chamber 118.

A substrate handler 126 includes a substrate handling robot 128 and substrate cassettes 130. The substrate handling robot 128 loads a substrate from one of the substrate cassettes 130 into the load lock 124 for cleaning. The substrate handling robot 128 may be operated at or near atmospheric pressure. When the load lock is ready, the substrate handling robot 122 transfers the substrate to one of the stations 114 of the processing chamber 110. Gas is supplied across the substrate when the substrate handling robot 122 moves the substrate as described herein.

Figure 9A:
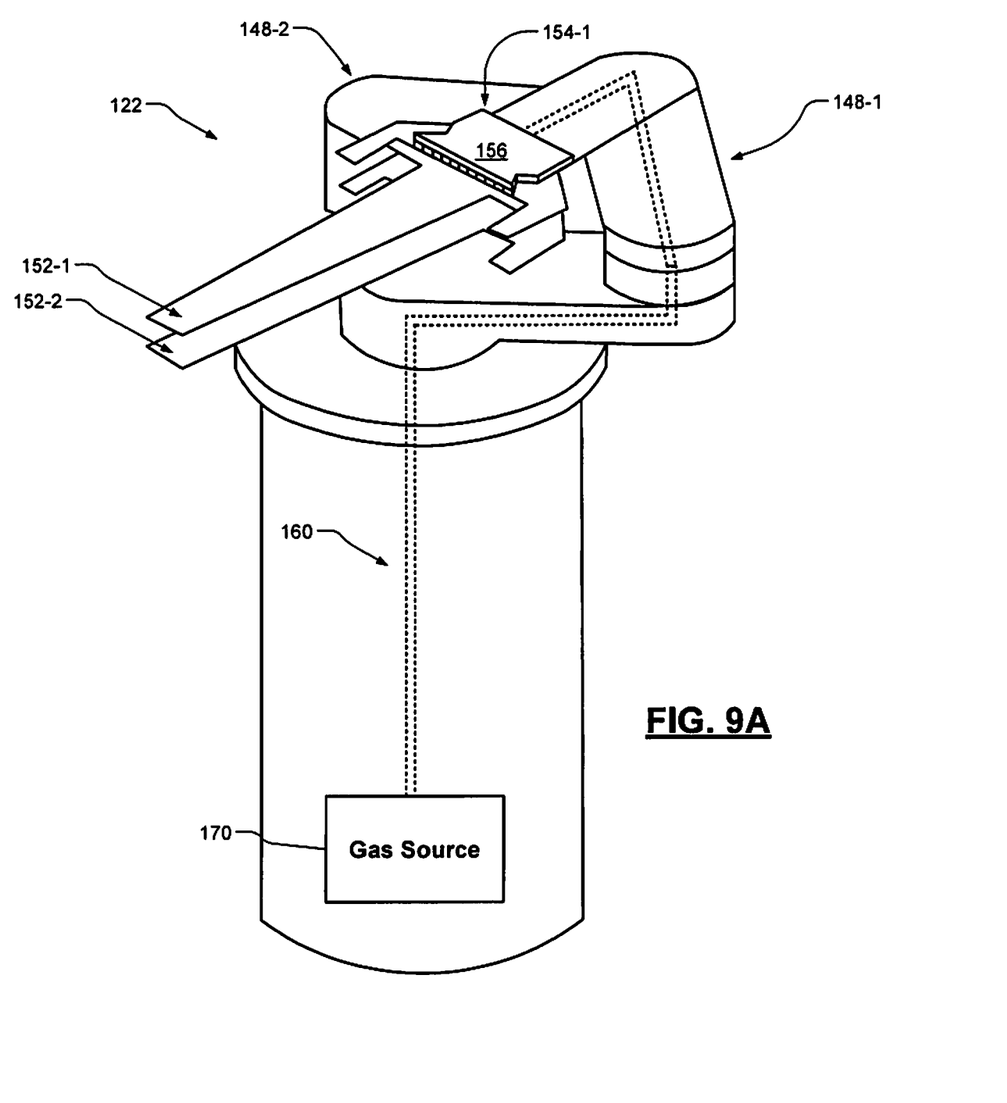
FIGS. 9A and 9B are perspective views of an example of a substrate handling robot with a housing arranged adjacent to the end effector.
Figure 9B:
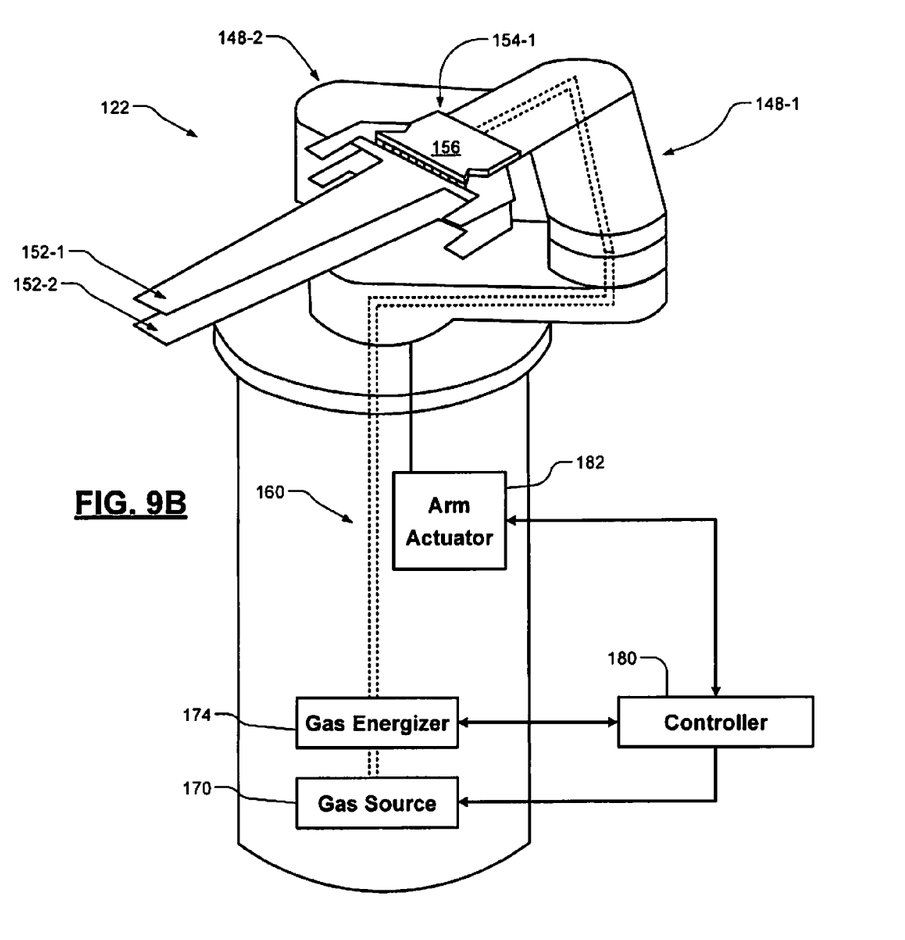

Referring now to FIGS. 9A-9B, an example of substrate handling robot 122 with first and second arms 148-1 and 148-2 is shown. The first and second arms 148-1 and 148-2 of the substrate handling robot 122 include first and second end effectors 152-1 and 152-2, respectively. A wrist portion 154-1 associated with the first arm 148-1 includes a housing 156, as described above. A flexible tube 160 is located inside of the substrate handling robot 122 and is used to supply gas to the wrist portion 154 that is connected to the end effector. The flexible tube 160 may include flexible polyurethane tube or other similar material. Rotary motion through the elbow and wrist portion may be handled through flexing of the polyurethane or equivalent line. Alternately, delivery of the gas may occur through a center shaft of a ferrofluidic seal assembly.

In FIG. 9A, a gas source 170 supplies gas to the flexible tube 160. A pump (not shown) may be used to increase a pressure of the gas. In FIG. 9B, the gas source 170 supplies gas to a gas energizer 174, which outputs activated gas to the flexible tube 160. The gas energizer 174 may comprise a remote plasma generator, an ultraviolet (UV) light and/or a heat source, which are used to activate gas species. A controller 180 may be used to control the gas energizer 174, the gas source 170 and an arm actuator 182. A similar arrangement may be used in FIG. 9A.

Figure 10A:
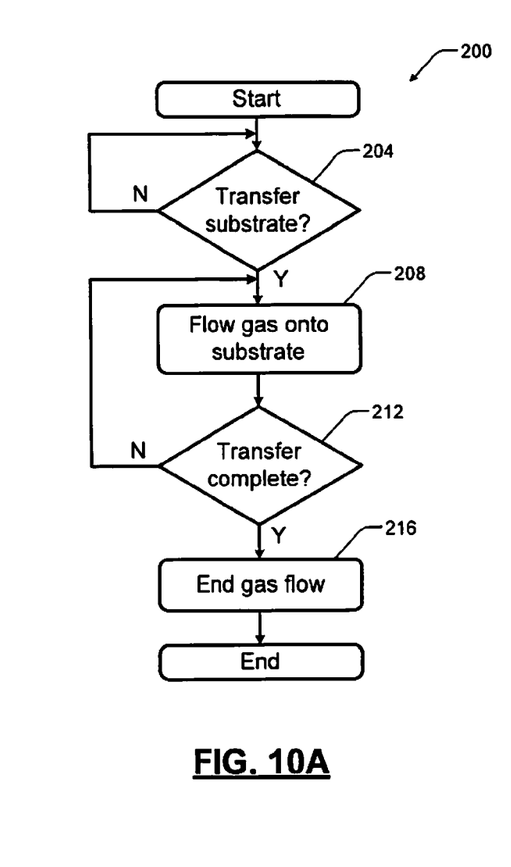
FIGS. 10A and 10B illustrate examples of methods for inhibiting oxide growth according to the present disclosure.

Referring now to FIG. 10A, an example of a method 200 is shown. At 204, control determines whether there is a substrate to transfer. At 208, control initiates flow of gas onto the substrate and moves the substrate. At 212, control determines whether the transfer of the substrate is complete. If not, control returns to 208. If true, control ends gas flow at 216.

Figure 10B:
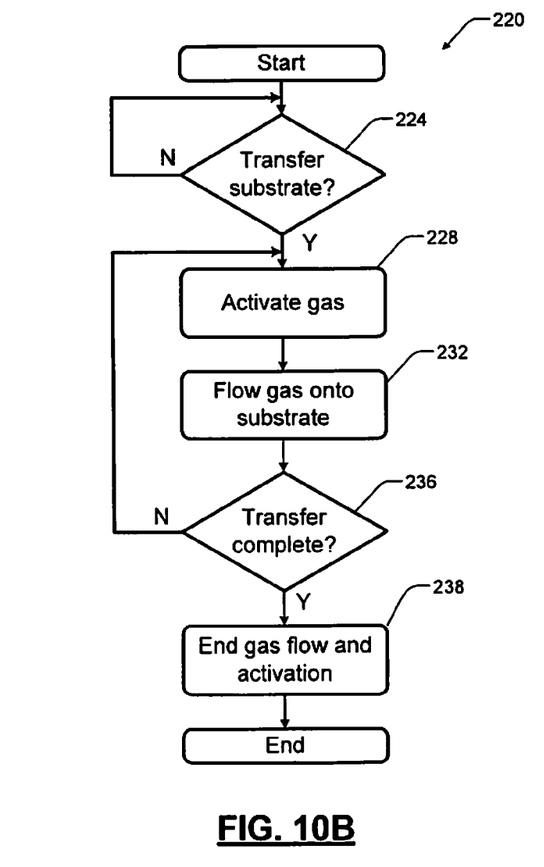

Referring now to FIG. 10B, an example of a method 220 is shown. At 224, control determines whether there is a substrate to transfer. At 228, control activates the gas using the gas energizer. At 232, control initiates flow of gas onto the substrate and moves the substrate to a desired location. At 236, control determines whether the transfer of the substrate is complete. If not, control returns to 228. If true, control ends gas flow and gas activation at 238.

The controller 180 may provide program instructions for implementing the above-described processes. The program instructions may control a variety of process parameters, such as power level, bias power level, pressure, gas flow, arm position, temperature, etc.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A substrate handling robot, comprising:
   an arm section;
   a wrist portion connected to the arm section;
   an end effector that is connected to the wrist portion and that is configured to support a substrate; and
   a housing that is fixed to the end effector and that includes a gas outlet that directs an oxide inhibiting gas across an exposed to surface of the substrate during transport,
   wherein neither the housing nor the gas outlet extends over the exposed surface when viewed from above.

2. The substrate handling robot of claim 1, wherein the housing includes an inlet, an outlet end including the gas outlet, a top surface, a bottom surface and side walls.

3. The substrate handling robot of claim 2, wherein:
   the housing comprises a plurality of baffles that are arranged between the side walls, the top surface, and the bottom surface and adjacent to the gas outlet; and
   at least one of the plurality of baffles is arranged generally parallel to the side walls and wherein at least another one of the plurality of baffles is arranged at an non-zero angle relative to the at least one of the plurality of baffles.

4. The substrate handling robot of claim 2, further comprising a flexible tube that is arranged inside of the arm section and that connects the inlet of the housing to a gas source.

5. The substrate handling robot of claim 1, wherein the gas outlet comprises a slit.

6. The substrate handling robot of claim 1, wherein the oxide inhibiting gas comprises one of an inert gas and a non-reactive gas.

7. The substrate handling robot of claim 1, wherein the oxide inhibiting gas comprises a reactive gas.

8. The substrate handling robot of claim 1, wherein the oxide inhibiting gas comprises an activated gas.

9. The substrate handling robot of claim 1, wherein the oxide inhibiting gas is directed across the exposed top surface of the substrate during transfer of the substrate between at least one of:
   a substrate cassette and a processing chamber;
   first and second stations of a processing chamber; and
   a load lock and a station of a processing chamber.

\* \* \* \* \*